(12) United States Patent
Koide

(10) Patent No.: US 12,514,092 B2
(45) Date of Patent: Dec. 30, 2025

(54) DETECTION DEVICE AND IMAGING DEVICE

(71) Applicant: Magnolia White Corporation, Tokyo (JP)

(72) Inventor: Gen Koide, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 64 days.

(21) Appl. No.: 17/713,299

(22) Filed: Apr. 5, 2022

(65) Prior Publication Data
US 2022/0328564 A1 Oct. 13, 2022

(30) Foreign Application Priority Data

Apr. 7, 2021 (JP) ................................. 2021-065412

(51) Int. Cl.
| | |
|---|---|
| *H10K 59/60* | (2023.01) |
| *H10F 39/12* | (2025.01) |
| *H10F 55/00* | (2025.01) |
| *H10K 39/32* | (2023.01) |
| *H10K 59/80* | (2023.01) |

(52) U.S. Cl.
CPC ........... *H10K 59/60* (2023.02); *H10F 39/192* (2025.01); *H10F 55/00* (2025.01); *H10K 39/32* (2023.02); *H10K 59/8792* (2023.02)

(58) Field of Classification Search
CPC .................... H10K 39/32; H10K 39/34; H01L 27/14–1467; H01L 27/14678
See application file for complete search history.

(56) References Cited

U.S. PATENT DOCUMENTS

| | | |
|---|---|---|
| 2009/0027358 A1 | 1/2009 | Hosono |
| 2010/0245556 A1 | 9/2010 | Kanda et al. |
| 2010/0245637 A1 | 9/2010 | Itonaga |
| 2014/0071316 A1 | 3/2014 | Asano et al. |
| 2015/0179693 A1* | 6/2015 | Maruyama ............ H10F 39/026 438/66 |
| 2019/0206917 A1 | 7/2019 | Nakajiki et al. |

(Continued)

FOREIGN PATENT DOCUMENTS

| | | |
|---|---|---|
| JP | H06-204444 A | 7/1994 |
| JP | 2009-032005 A | 2/2009 |

(Continued)

OTHER PUBLICATIONS

Office Action issued in related Japanese Patent Application No. 2021-065412 mailed on Apr. 23, 2024 and English translation of same. 10 pages.

(Continued)

*Primary Examiner* — Zandra V Smith
*Assistant Examiner* — Molly K Reida
(74) *Attorney, Agent, or Firm* — K&L Gates LLP

(57) ABSTRACT

According to an aspect, a detection device includes: a light source configured to emit light that includes a first wavelength band and a second wavelength band; a first color filter configured to transmit light in the first wavelength band; a second color filter configured to transmit light in the second wavelength band; a first photodiode configured to receive light transmitted through the first color filter; and a second photodiode configured to receive light transmitted through the second color filter.

14 Claims, 12 Drawing Sheets

(56) References Cited

U.S. PATENT DOCUMENTS

2021/0326623 A1\* 10/2021 Kato .................... H01L 31/167
2022/0181406 A1\* 6/2022 Seo ..................... G06F 3/0412

FOREIGN PATENT DOCUMENTS

| JP | 2010-231336 A | 10/2010 | |
|----|----|----|----|
| JP | 2010-239076 A | 10/2010 | |
| JP | 2012-238774 A | 12/2012 | |
| WO | WO2018/043654 A1 | 3/2018 | |
| WO | WO-2020137129 A1 \* | 7/2020 | ........... A61B 5/1172 |

OTHER PUBLICATIONS

Office Action issued in related Japanese Patent Application No. 2021-065412 mailed on Sep. 24, 2024 and English translation of same. 10 pages.

\* cited by examiner

DETECTION DEVICE AND IMAGING DEVICE

CROSS-REFERENCE TO RELATED APPLICATION

This application claims the benefit of priority from Japanese Patent Application No. 2021-065412 filed on Apr. 7, 2021, the entire contents of which are incorporated herein by reference.

BACKGROUND

1. Technical Field

What is disclosed herein relates to a detection device and an imaging device.

2. Description of the Related Art

Optical sensors capable of detecting fingerprint patterns and vascular patterns are known (for example, Japanese Patent Application Laid-open Publication No. 2009-032005). Among such optical sensors, sensors are known each including a plurality of photodiodes each including an organic semiconductor material used as an active layer.

The optical sensors are required to detect not only a shape of a fingerprint of an object to be detected such as a finger or a palm, but also various types of biological information on the object to be detected (such as a vascular image, a pulse wave, pulsation, and a blood oxygen level of the finger or the palm). Therefore, light in different wavelength bands depending on the object to be detected may be required to be detected by the same optical sensor.

For the foregoing reasons, there is a need for a detection device and an imaging device capable of detecting light in a plurality of wavelength bands using the same sensor.

SUMMARY

According to an aspect, a detection device includes: a light source configured to emit light that includes a first wavelength band and a second wavelength band; a first color filter configured to transmit light in the first wavelength band; a second color filter configured to transmit light in the second wavelength band; a first photodiode configured to receive light transmitted through the first color filter; and a second photodiode configured to receive light transmitted through the second color filter.

According to an aspect, an imaging device includes: the detection device; and an image processor configured to generate two-dimensional information based on detection signals from the first photodiode, the second photodiode, and the third photodiode.

DETAILED DESCRIPTION

Figure 1:
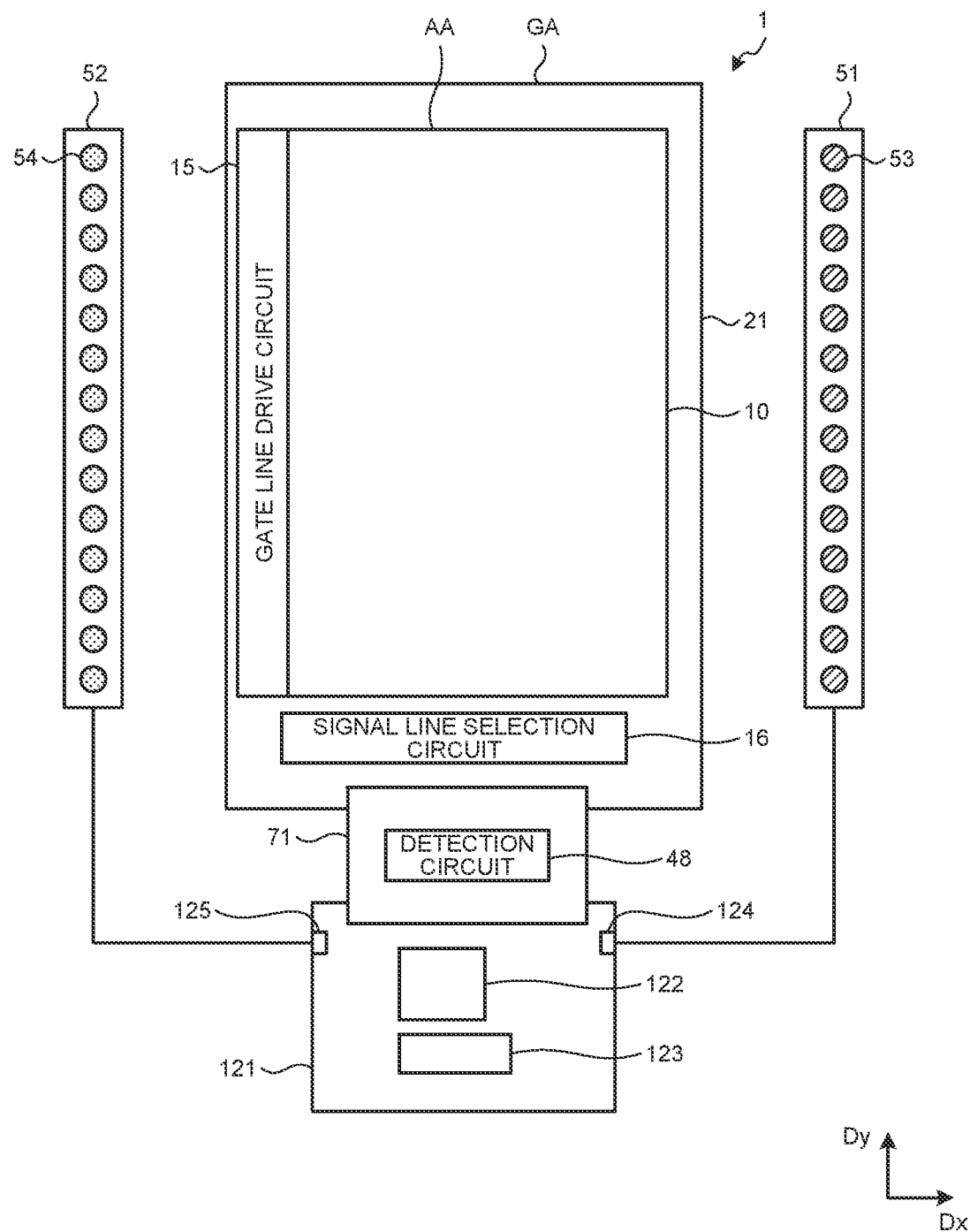
FIG. 1 is a plan view illustrating a detection device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a plan view illustrating a detection device according to a first embodiment. As illustrated in FIG. 1, a detection device 1 includes a sensor base member 21 (substrate), a sensor 10, a gate line drive circuit 15, a signal line selection circuit 16, a detection circuit 48, a control circuit 122, a power supply circuit 123, a first light source base member 51, a second light source base member 52, and light sources 53 and 54. The first light source base member 51 is provided with the light sources 53. The second light source base member 52 is provided with the light sources 54.

The sensor base member 21 is electrically coupled to a control substrate 121 through a flexible printed circuit board 71. The flexible printed circuit board 71 is provided with the detection circuit 48. The control substrate 121 is provided with the control circuit 122 and the power supply circuit 123. The control circuit 122 is, for example, a field-programmable gate array (FPGA). The control circuit 122 supplies control signals to the sensor 10, the gate line drive circuit 15, and the signal line selection circuit 16 to control a detection operation of the sensor 10. The control circuit 122 supplies control signals to the light sources 53 and 54 to control lighting and non-lighting of the light sources 53 and 54. The power supply circuit 123 supplies voltage signals including, for example, a sensor power supply signal VDDSNS (refer to FIG. 4) to the sensor 10, the gate line drive circuit 15, and the signal line selection circuit 16. The power supply circuit 123 supplies a power supply voltage to the light sources 53 and 54.

The sensor base member 21 has a detection area AA and a peripheral area GA. The detection area AA is an area provided with a plurality of photodiodes PD (refer to FIG. 4) included in the sensor 10. The peripheral area GA is an area between the outer perimeter of the detection area AA and ends of the sensor base member 21 and is an area not provided with the photodiodes PD.

The gate line drive circuit 15 and the signal line selection circuit 16 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA and is provided between the sensor 10 and the detection circuit 48.

In the following descriptions, the first direction Dx is one direction in a plane parallel to the sensor base member 21. The second direction Dy is one direction in the plane parallel to the sensor base member 21 and is a direction orthogonal to the first direction Dx. The second direction Dy may non-orthogonally intersect the first direction Dx. The term "plan view" refers to a positional relation when viewed from a direction orthogonal to the sensor base member 21.

The light sources 53 are provided on the first light source base member 51 and are arranged along the second direction Dy. The light sources 54 are provided on the second light source base member 52 and are arranged along the second direction Dy. The first light source base member 51 and the second light source base member 52 are electrically coupled, through terminals 124 and 125, respectively, provided on the control substrate 121, to the control circuit 122 and the power supply circuit 123.

For example, inorganic light-emitting diodes (LEDs) or organic electroluminescence devices (organic light-emitting diodes: OLEDs) are used as the light sources 53 and 54. The light sources 53 and 54 both emit light L1 that includes first and second wavelength bands. The first wavelength band is a wavelength band that represents, for example, red, and the second wavelength band is a wavelength band that represents infrared light.

Light L1a in the first wavelength band (such as red) of the light L1 emitted from the light sources 53 and 54 is mainly reflected on a surface of an object to be detected such as a finger, and is incident on the sensor 10. As a result, the sensor 10 can detect a fingerprint by detecting a shape of asperities on the surface of the finger or the like. Light Lib in the second wavelength band (such as infrared light) of the light L1 emitted from the light sources 53 and 54 is mainly reflected in the finger or the like, or transmitted through the finger or the like, and is incident on the sensor 10. As a result, the sensor 10 can detect information on a living body such as the finger or the like. Examples of the information on the living body include a pulse wave, pulsation, and a vascular image of the finger or a palm. That is, the detection device 1 may be configured as a fingerprint detection device to detect a fingerprint or a blood-vessel detection device to detect a vascular pattern of, for example, veins.

For example, the first wavelength band may have a wavelength of from 500 nm to 600 nm, for example, a wavelength of approximately 550 nm, and the second wavelength band may have a wavelength of from 780 nm and 950 nm, for example, a wavelength of approximately 850 nm. In this case, the light L1a in the first wavelength band is blue or green visible light, and the light L1b in the second wavelength band is infrared light. The sensor 10 can detect a fingerprint based on the light L1a in the first wavelength band emitted from the light sources 53 and 54. Alternatively, the light L1b in the second wavelength band emitted from the light sources 53 and 54 is reflected in the object to be detected such as a finger, or transmitted through or absorbed by a finger or the like and is incident on the sensor 10. As a result, the sensor 10 can detect the pulse wave or the vascular image (vascular pattern) as the information on the living body in the finger or the like.

Alternatively, the first wavelength band may have a wavelength of from 600 nm to 700 nm, for example, approximately 660 nm, and the second wavelength band may have a wavelength of from 780 nm and 900 nm, for example, approximately 850 nm. In this case, the sensor 10 can detect a blood oxygen saturation level in addition to the pulse wave, the pulsation, and the vascular image as the information on the living body based on the light L1a in the first wavelength band and the light L1b in second wavelength band emitted from the light sources 53 and 54. In this manner, the detection device 1 can detect the various information on the living body by performing the detection based on the light L1a in the first wavelength band and the detection based on the light L1b in the second wavelength band.

The arrangement of the light sources 53 and 54 illustrated in FIG. 1 is merely an example and may be changed as appropriate. The detection device 1 is provided with the light sources 53 and 54 of one type as light sources. However, the light sources are not limited thereto, and two or more types of light sources may be provided. In this case, for example, the light sources 53 and the light sources 54 may be arranged on each of the first light source base member 51 and the second light source base member 52. The light sources 53 and 54 may be provided on one light source base member, or three or more light source base members. At least one light source needs to be disposed.

Figure 2:
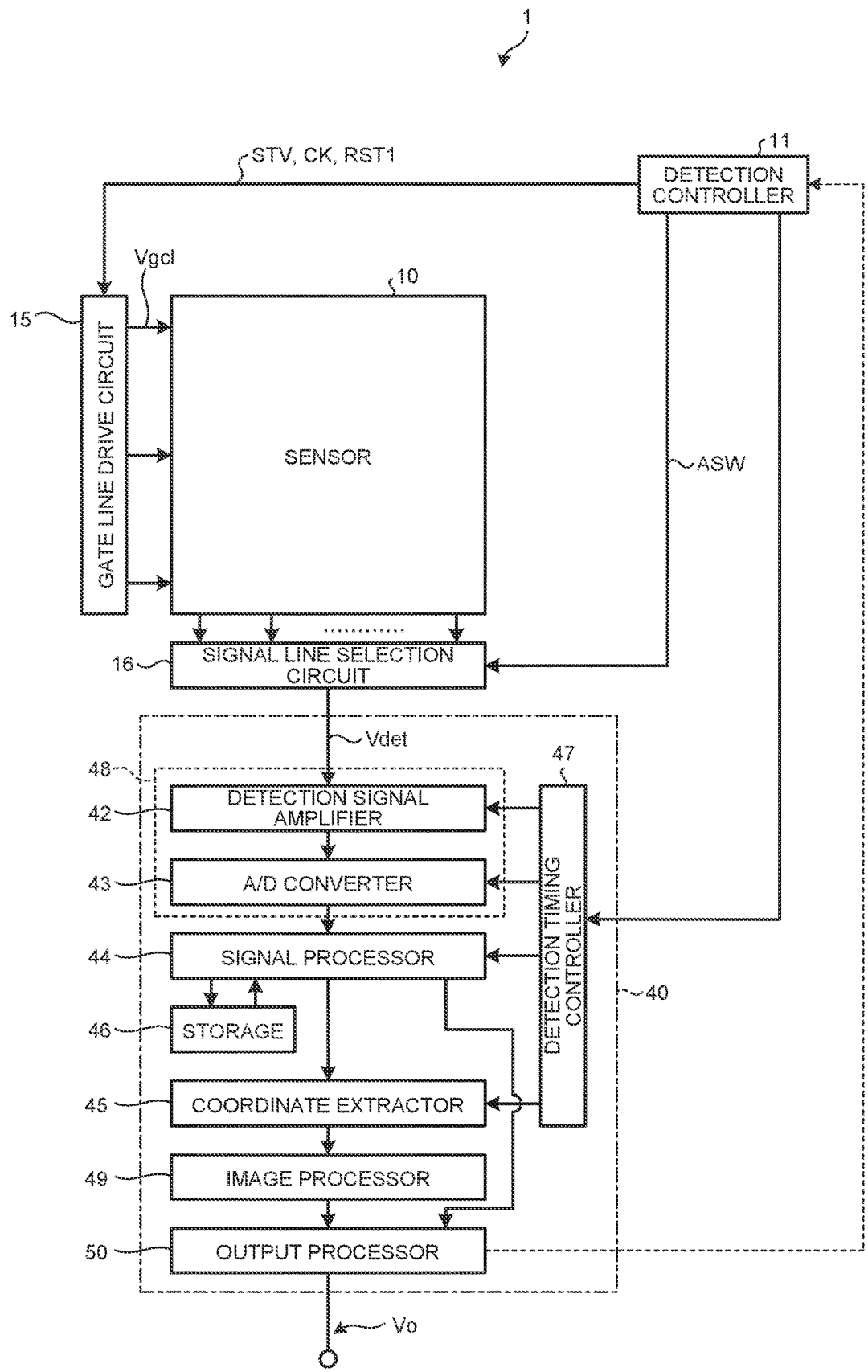
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection controller 11 and a detector (detection signal processing circuit) 40. The control circuit 122 includes one, some, or all functions of the detection controller 11. The control circuit 122 also includes one, some, or all functions of the detector 40 except those of the detection circuit 48.

The sensor 10 includes the photodiodes PD. Each of the photodiodes PD included in the sensor 10 outputs an electrical signal corresponding to light irradiating the photodiode PD as a detection signal Vdet to the signal line selection circuit 16. The sensor 10 performs the detection in response to a gate drive signal Vgcl supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals such as a start signal STV, a clock signal CK, and a reset signal RST1 to the gate line drive circuit 15. The detection controller 11 also supplies various control signals such as a selection signal ASW to the signal line selection circuit 16. The detection controller 11 supplies various control signals to the light sources 53 and 54 to control the lighting and non-lighting of the respective light sources 53 and 54.

The gate line drive circuit 15 is a circuit that drives a plurality of gate lines GCL (refer to FIG. 3) based on the various control signals. The gate line drive circuit 15 sequentially or simultaneously selects the gate lines GCL and supplies the gate drive signals Vgcl to the selected gate lines GCL. By this operation, the gate line drive circuit 15 selects the photodiodes PD coupled to the gate lines GCL.

Figure 3:
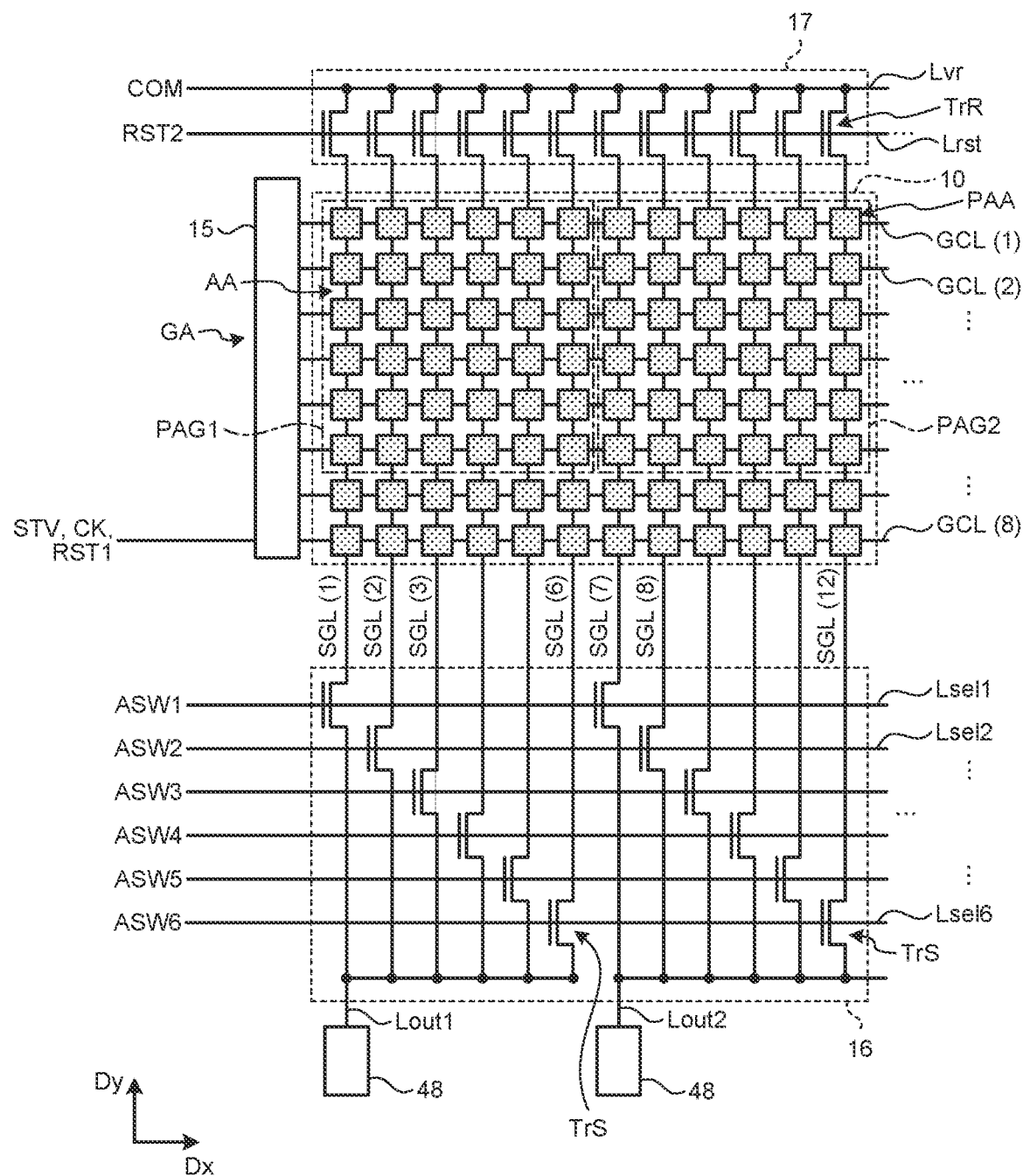
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 couples the selected signal lines SGL to the detection circuit 48 based on the selection signal ASW supplied from the detection controller (detection control circuit) 11. By this operation, the signal line selection circuit 16 outputs the detection signals Vdet of the photodiodes PD to the detector 40.

The detector 40 includes the detection circuit 48, a signal processor (signal processing circuit) 44, a coordinate extractor (coordinate extraction circuit) 45, a storage (storage circuit) 46, a detection timing controller (detection timing control circuit) 47, an image processor (image processing circuit) 49, and an output processor (output processing circuit) 50. Based on a control signal supplied from the detection controller 11, the detection timing controller 47 controls the detection circuit 48, the signal processor 44, the coordinate extractor 45, and the image processor 49 so as to operate in synchronization with one another.

The detection circuit 48 is, for example, an analog front-end (AFE) circuit. The detection circuit 48 is a signal processing circuit having functions of at least a detection signal amplifier 42 and an analog-to-digital (A/D) converter 43. The detection signal amplifier 42 amplifies the detection signals Vdet. The A/D converter 43 converts analog signals output from the detection signal amplifier 42 into digital signals.

The signal processor 44 is a logic circuit that detects a predetermined physical quantity received by the sensor 10 based on an output signal of the detection circuit 48. When the finger is in contact with or in proximity to a detection surface, the signal processor 44 can detect the asperities on the surface of the finger or the palm based on the signal from the detection circuit 48. The signal processor 44 can also detect the information on the living body based on the signal from the detection circuit 48. Examples of the information on the living body include the vascular image, the pulse wave, the pulsation, and the blood oxygen level of the finger or the palm.

The signal processor 44 may also perform processing of acquiring the detection signals Vdet (information on the living body) simultaneously detected by the photodiodes PD, and averaging the detection signals Vdet. In this case, the detector 40 can perform stable detection by reducing measurement errors caused by relative positional misalignment between the object to be detected, such as the finger, and the sensor 10.

The storage 46 temporarily stores therein a signal calculated by the signal processor 44. The storage 46 may be, for example, a random-access memory (RAM) or a register circuit.

The coordinate extractor 45 is a logic circuit that obtains, when the contact or the proximity of a finger is detected by the signal processor 44, detected coordinates of the asperities on the surface of the finger or the like. The coordinate extractor 45 is also a logic circuit that obtains detected coordinates of blood vessels of the finger or the palm. The image processor 49 combines the detection signals Vdet output from the respective photodiodes PD of the sensor 10 to generate two-dimensional information representing the shape of the asperities on the surface of the finger or the like and two-dimensional information representing the shape of the blood vessels of the finger or the palm. The coordinate extractor 45 may output the detection signals Vdet as sensor output voltages Vo instead of calculating the detected coordinates. A case can be considered where the detector 40 does not include the coordinate extractor 45 and the image processor 49.

The output processor 50 serves as a processor that performs processing based on the outputs from the photodiodes PD. The output processor 50 may include, for example, the detected coordinates obtained by the coordinate extractor 45 and the two-dimensional information generated by the image processor 49 in the sensor output voltages Vo. The function of the output processor 50 may be integrated into another component (such as the image processor 49).

The following describes a circuit configuration example of the detection device 1. FIG. 3 is a circuit diagram illustrating the detection device. As illustrated in FIG. 3, the sensor 10 has a plurality of partial detection areas PAA arranged in a matrix having a row-column configuration. Each of the partial detection areas PAA is provided with the photodiode PD.

The gate lines GCL extend in the first direction Dx, and are coupled to the partial detection areas PAA arranged in the first direction Dx. A plurality of gate lines GCL(1), GCL(2), ..., GCL(8) are arranged in the second direction Dy, and are each coupled to the gate line drive circuit 15. In the following description, the gate lines GCL(1), GCL(2), ..., GCL(8) will each be simply referred to as the gate line GCL when they need not be distinguished from one another. For ease of understanding of the description, FIG. 3 illustrates eight gate lines GCL. However, this is merely an example, and M gate lines GCL (where M is eight or larger, and is, for example, 256) may be arranged.

The signal lines SGL extend in the second direction Dy, and are coupled to the photodiodes PD of the partial detection areas PAA arranged in the second direction Dy. A plurality of signal lines SGL(1), SGL(2), ..., SGL(12) are arranged in the first direction Dx, and are each coupled to the signal line selection circuit 16 and a reset circuit 17. In the following description, the signal lines SGL(1), SGL(2), ..., SGL(12) will each be simply referred to as the signal line SGL when they need not be distinguished from one another.

For ease of understanding of the description, 12 of the signal lines SGL are illustrated. However, this is merely an example, and N signal lines SGL (where N is 12 or larger, and is, for example, 252) may be arranged. The resolution of the sensor is, for example, 508 dots per inch (dpi), and the number of cells is 252×256. In FIG. 3, the sensor 10 is provided between the signal line selection circuit 16 and the reset circuit 17. The present disclosure is not limited thereto. The signal line selection circuit 16 and the reset circuit 17 may be coupled to ends of the signal lines SGL in the same direction.

The gate line drive circuit 15 receives the various control signals such as the start signal STV, the clock signal CK, and the reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding ones of the partial detection areas PAA arranged in the first direction Dx are selected as detection targets.

The signal line selection circuit 16 includes a plurality of selection signal lines Lsel, a plurality of output signal lines Lout, and third switching elements TrS. The third switching elements TrS are provided corresponding to the signal lines SGL. Six signal lines SGL(1), SGL(2), . . . , SGL(6) are coupled to a common output signal line Lout1. Six signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

The control circuit 122 (refer to FIG. 1) sequentially supplies the selection signal ASW to the selection signal lines Lsel. Through the operations of the third switching elements TrS, the signal line selection circuit 16 sequentially selects the signal lines SGL in one of the signal line blocks in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs. The signal line selection circuit 16 may couple a plurality of the signal lines SGL collectively to the detection circuit 48.

As illustrated in FIG. 3, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 4) included in each of the partial detection areas PAA.

Figure 4:
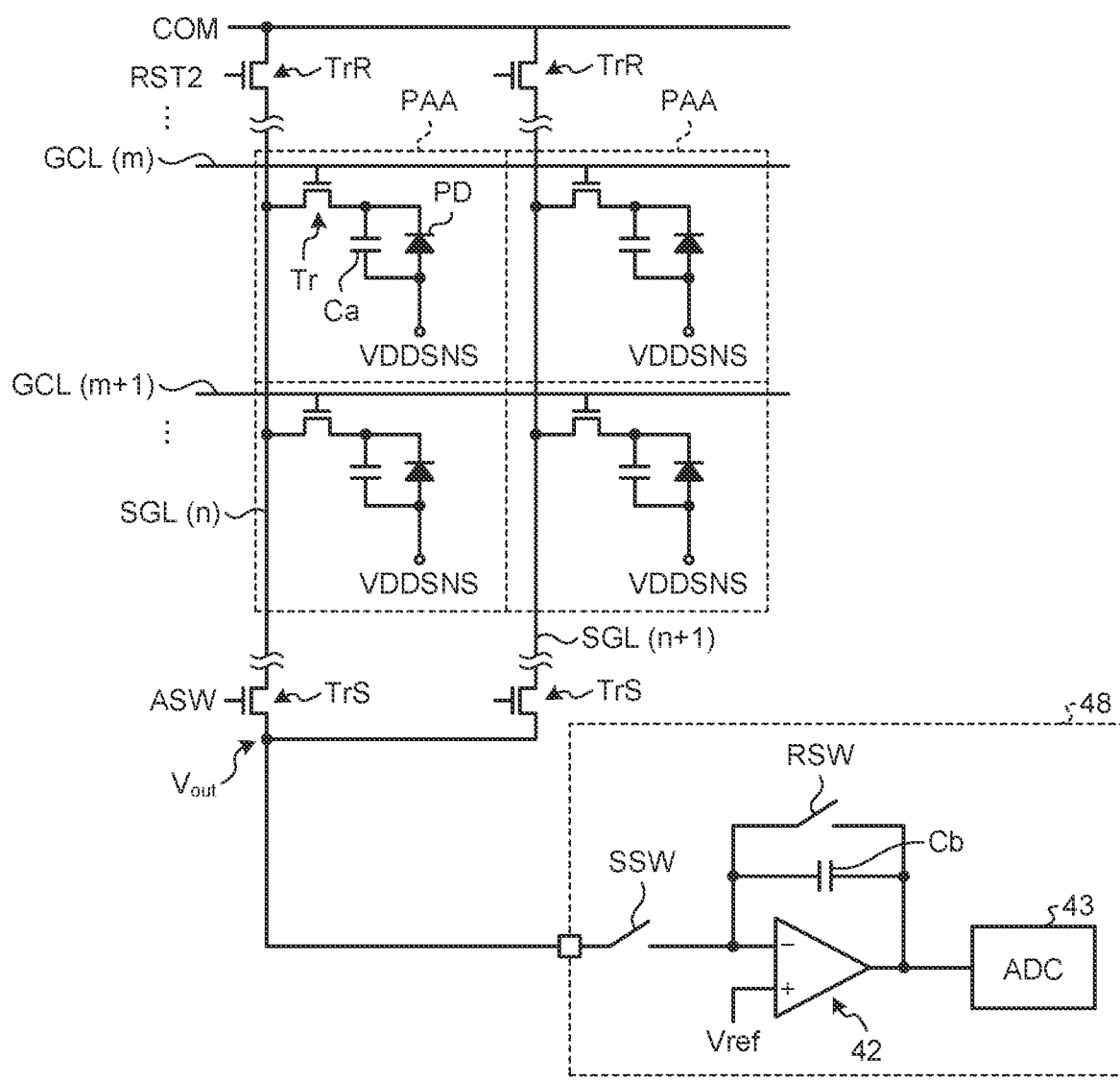
FIG. 4 is a circuit diagram illustrating a plurality of partial detection areas.

FIG. 4 is a circuit diagram illustrating the partial detection areas. FIG. 4 also illustrates a circuit configuration of the detection circuit 48. As illustrated in FIG. 4, each of the partial detection areas PAA includes the photodiode PD, the capacitive element Ca, and a corresponding one of the first switching elements Tr. The capacitive element Ca is capacitance (sensor capacitance) generated in the photodiode PD and is equivalently coupled in parallel with the photodiode PD.

FIG. 4 illustrates two gate lines GCL(m) and GCL(m+1) arranged in the second direction Dy among the gate lines GCL. FIG. 4 also illustrates two signal lines SGL(n) and SGL(n+1) arranged in the first direction Dx among the signal lines SGL. The partial detection area PAA is an area surrounded by the gate lines GCL and the signal lines SGL.

Each of the first switching elements Tr is provided correspondingly to the photodiode PD. The first switching element Tr includes a thin-film transistor, and in this example, includes an n-channel metal oxide semiconductor (MOS) thin-film transistor (TFT).

The gates of the first switching elements Tr belonging to the partial detection areas PAA arranged in the first direction Dx are coupled to the gate line GCL. The sources of the first switching elements Tr belonging to the partial detection areas PAA arranged in the second direction Dy are coupled to the signal line SGL. The drain of the first switching element Tr is coupled to the cathode of the photodiode PD and the capacitive element Ca.

The anode of the photodiode PD is supplied with the sensor power supply signal VDDSNS from the power supply circuit 123. The signal line SGL and the capacitive element Ca are supplied with the reference signal COM that serves as an initial potential of the signal line SGL and the capacitive element Ca from the power supply circuit 123.

When the partial detection area PAA is irradiated with light, a current corresponding to the amount of the light flows through the photodiode PD. As a result, an electrical charge is stored in the capacitive element Ca. After the first switching element Tr is turned on, a current corresponding to the electrical charge stored in the capacitive element Ca flows through the signal line SGL. The signal line SGL is coupled to the detection circuit 48 through a corresponding one of the third switching elements TrS of the signal line selection circuit 16. Thus, the detection device 1 can detect a signal corresponding to the amount of the light irradiating the photodiode PD in each of the partial detection areas PAA or each block unit PAG.

During a reading period Pdet (refer to FIG. 6), a switch SSW of the detection circuit 48 is turned on, and the detection circuit 48 is coupled to the signal lines SGL. The detection signal amplifier 42 of the detection circuit 48 converts a variation of a current supplied from the signal lines SGL into a variation of a voltage, and amplifies the result. A reference potential (Vref) having a fixed potential is supplied to a non-inverting input portion (+) of the detection signal amplifier 42, and the signal lines SGL are coupled to an inverting input terminal (−) of the detection signal amplifier 42. In the present embodiment, the same signal as the reference signal COM is supplied as the reference potential (Vref). The signal processor 44 (refer to FIG. 2) calculates the difference between the detection signal Vdet when light irradiates the photodiode PD and the detection signal Vdet when light does not irradiate the photodiode PD as the sensor output voltage Vo. The detection signal amplifier 42 includes a capacitive element Cb and a reset switch RSW. During a reset period Prst (refer to FIG. 6), the reset switch RSW is turned on, and an electrical charge of the capacitive element Cb is reset.

Figure 5:
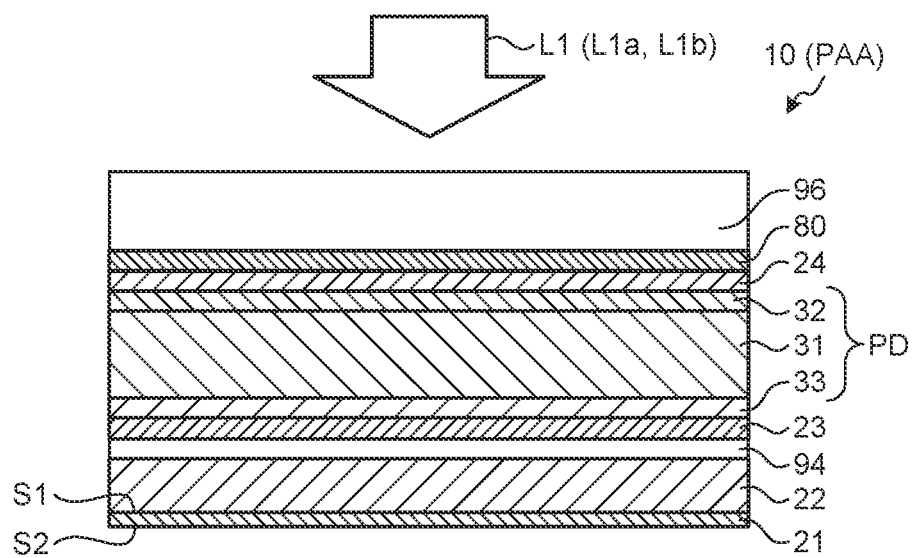
FIG. 5 is a sectional view illustrating a schematic sectional configuration of a sensor.

FIG. 5 is a sectional view illustrating a schematic sectional configuration of the sensor. As illustrated in FIG. 5, the sensor 10 includes the sensor base member 21, a TFT layer 22, an organic insulating film 94, a lower electrode 23, the photodiode PD, an upper electrode 24, an optical filter layer 80, and a sealing film 96. The sensor base member 21 is an insulating base member, and is made using, for example, glass or a resin material. The sensor base member 21 is not limited to having a flat plate shape and may have a curved surface. In this case, the sensor base member 21 can be a film-like resin. The sensor base member 21 has a first surface S1 and a second surface S2 on the opposite side to the first surface S1. The TFT layer 22, the organic insulating film 94, a lower electrode 23, the photodiode PD, the upper electrode 24, the optical filter layer 80, and the sealing film 96 are stacked on the first surface S1 in the order as listed. In the present embodiment, a configuration will be described in which the light L1 irradiates the photodiode PD from the first surface S1 side. However, the sensor 10 is not limited to this configuration and may have a configuration in which the light L1 irradiates the photodiode PD from the second surface S2 side.

The TFT layer 22 is provided with circuits such as the gate line drive circuit 15 and the signal line selection circuit 16 described above. The TFT layer 22 is provided with TFTs such as the first switching elements Tr and various types of wiring such as the gate lines GCL and signal lines SGL. The sensor base member 21 and the TFT layer 22 are a drive circuit board that drives the sensor for each predetermined detection area, and are also called a backplane or an array substrate.

The organic insulating film 94 is provided on the TFT layer 22. The organic insulating film 94 is a planarizing layer that planarizes asperities formed by the first switching element Tr formed in the TFT layer 22 and by various conductive layers.

The lower electrode 23 is provided on the organic insulating film 94 and is electrically coupled to the first switching element Tr in the TFT layer 22 through a contact hole (not illustrated). The lower electrode 23 is the cathode of the photodiode PD and is an electrode for reading the detection signal Vdet. The lower electrode 23 is formed of, for example, a light-transmitting conductive material such as indium tin oxide (ITO). Alternatively, since the detection device 1 is a top-surface light receiving optical sensor as described above, the lower electrode 23 can be made using, for example, a metal material such as silver (Ag). Alternatively, the lower electrode 23 may be a metal material such as aluminum (Al) or an alloy material containing at least one or more of these metal materials.

The photodiode PD is provided on the lower electrode 23. The photodiode PD includes an electron transport layer 33, an active layer 31, and a hole transport layer 32 stacked on the lower electrode 23 in the order as listed, in a direction orthogonal to the first surface S1 of the sensor base member 21.

The active layer 31 changes in characteristics (for example, voltage-current characteristics and a resistance value) depending on light emitted thereto. An organic material is used as a material of the active layer 31. Specifically, the active layer 31 has a bulk heterostructure in which a p-type organic semiconductor is mixed with an n-type fullerene derivative (PCBM) serving as an n-type organic semiconductor. As the active layer 31, low-molecular-weight organic materials can be used including, for example, fullerene ($C_{60}$), phenyl-$C_{61}$-butyric acid methyl ester (PCBM), copper phthalocyanine (CuPc), fluorinated copper phthalocyanine ($F_{16}$CuPc), rubrene (5,6,11,12-tetraphenyltetracene), and PDI (a derivative of perylene).

The active layer 31 can be formed by a vapor deposition process (dry process) using the above-listed low-molecular-weight organic materials. In this case, the active layer 31 may be, for example, a multilayered film of CuPc and $F_{16}$CuPc, or a multilayered film of rubrene and $C_{60}$. The active layer 31 can also be formed by a coating process (wet process). In this case, the active layer 31 is made using a material obtained by combining the above-listed low-molecular-weight organic materials with high-molecular-weight organic materials. As the high-molecular-weight organic materials, for example, poly(3-hexylthiophene) (P3HT) and F8-alt-benzothiadiazole (F8BT) can be used. The active layer 31 can be a film in the state of a mixture of P3HT and PCBM or a film in the state of a mixture of F8BT and PDI.

The upper electrode 24 is the anode of the photodiode PD and is an electrode for supplying the power supply signal VDDSNS to a photoelectric conversion layer. The upper electrode 24 faces the lower electrode 23 with the active layer 31 interposed therebetween. The upper electrode 24 is formed of, for example, a light-transmitting conductive material such as ITO or indium zinc oxide (IZO).

The electron transport layer 33 and the hole transport layer 32 are provided to facilitate holes and electrons generated in the active layer 31 to reach the upper electrode 24 or the lower electrode 23. The electron transport layer 33 is provided between the lower electrode 23 and the active layer 31 in the direction orthogonal to the first surface S1 of the sensor base member 21. The electron transport layer 33 is in direct contact with the top of the lower electrode 23, and the active layer 31 is in direct contact with the top of the electron transport layer 33. Ethoxylated polyethylenimine (PEIE) is used as a material of the electron transport layer 33.

The hole transport layer 32 is provided between the active layer 31 and the upper electrode 24 in the direction orthogonal to the first surface S1 of the sensor base member 21. The hole transport layer 32 is in direct contact with the top of the active layer 31, and the upper electrode 24 is in direct contact with the top of the hole transport layer 32. The hole transport layer 32 is a metal oxide layer. For example, tungsten oxide ($WO_3$) or molybdenum oxide is used as the oxide metal layer.

The optical filter layer 80 is provided on the upper electrode 24. The optical filter layer 80 selects the light L1a in the first wavelength band or the light L1b in the second wavelength band from the light L1, and transmits the light L1a in the first wavelength band or the light L1b in the second wavelength band to the photodiode PD. A detailed structure of the optical filter layer 80 will be described later.

The sealing film 96 is provided so as to cover the optical filter layer 80. The sealing film 96 well seals the photodiode PD and thus can restrain water from entering the photodiode PD from the upper surface side. When the optical filter layer 80 has a function of a sealing film, the sealing film 96 can be omitted. Alternatively, the sealing film 96 can be made thinner.

Figure 6:
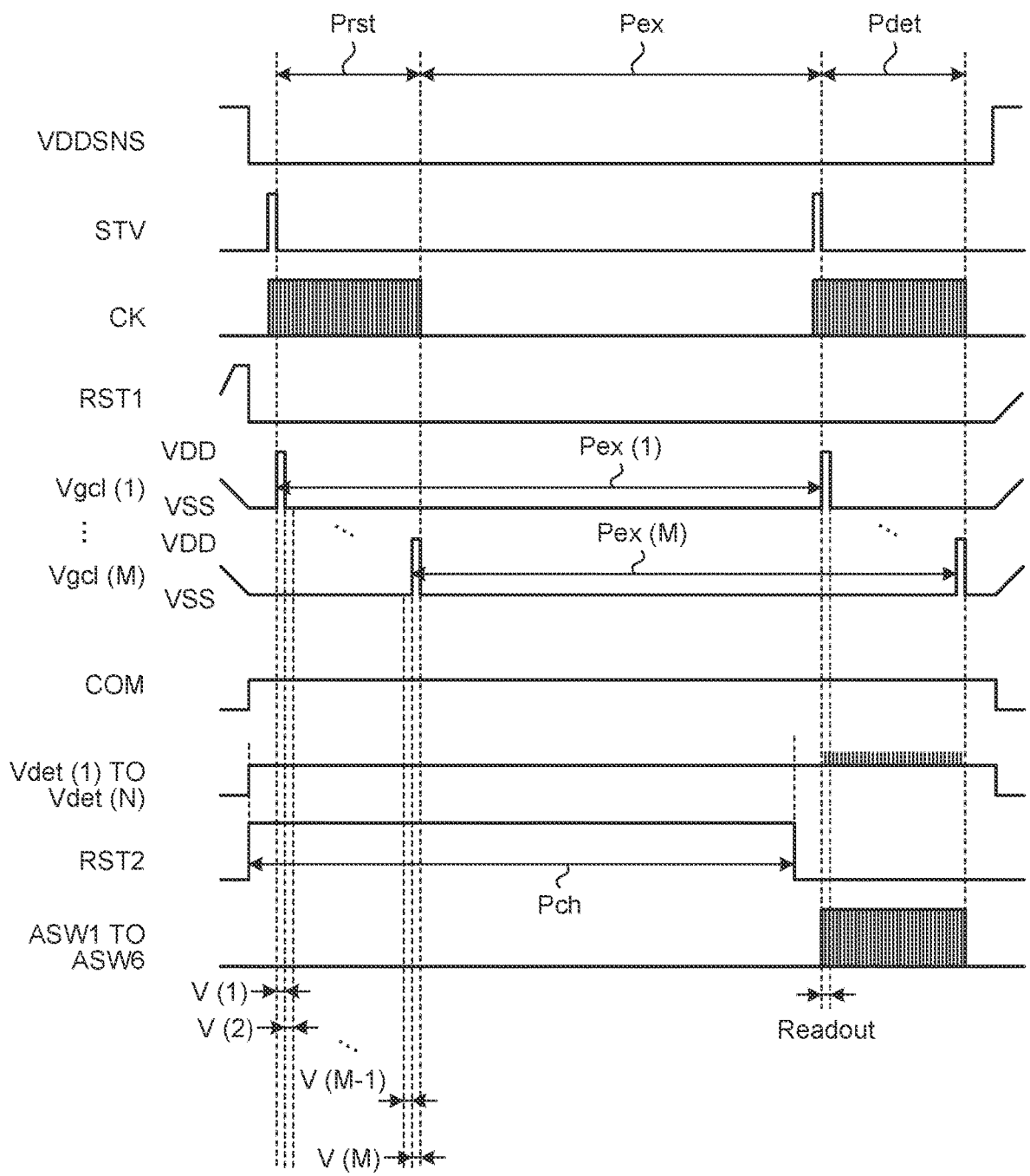
FIG. 6 is a timing waveform diagram illustrating an operation example of the detection device.

The following describes an operation example of the detection device 1. FIG. 6 is a timing waveform diagram illustrating the operation example of the detection device. As illustrated in FIG. 6, the detection device 1 has the reset period Prst, an exposure period Pex, and the reading period Pdet. The power supply circuit 123 supplies the sensor power supply signal VDDSNS to the anode of the photodiode PD over the reset period Prst, the exposure period Pex, and the reading period Pdet. The sensor power supply signal VDDSNS is a signal for applying a reverse bias between the anode and the cathode of the photodiode PD. For example, the reference signal COM of substantially 0.75 V is applied to the cathode of the photodiode PD, and the sensor power supply signal VDDSNS of substantially −1.25 V is applied to the anode of the photodiode PD. As a result, a reverse bias of substantially 2.0 V is applied between the anode and the cathode. The control circuit 122 sets the reset signal RST2 to "H", and then, supplies the start signal STV and the clock signal CK to the gate line drive circuit 15 to start the reset period Prst. During the reset period Prst, the control circuit 122 supplies the reference signal COM to the reset circuit 17, and uses the reset signal RST2 to turn on the fourth switching elements TrR for supplying a reset voltage. This operation supplies the reference signal COM as the reset voltage to each of the signal lines SGL. The reference signal COM is set to, for example, 0.75 V.

During the reset period Prst, the gate line drive circuit 15 sequentially selects each of the gate lines GCL based on the start signal STV, the clock signal CK, and the reset signal RST1. The gate line drive circuit 15 sequentially supplies the gate drive signals Vgcl {Vgcl(1), ..., Vgcl(M)} to the gate lines GCL. The gate drive signal Vgcl has a pulsed waveform having a power supply voltage VDD serving as a high-level voltage and a power supply voltage VSS serving as a low-level voltage. In FIG. 6, M gate lines GCL (where M is, for example, 256) are provided, and the gate drive signals Vgcl(1), ..., Vgcl(M) are sequentially supplied to the respective gate lines GCL. Thus, the first switching elements Tr are sequentially brought into a conducting state and supplied with the reset voltage on a row-by-row basis. For example, a voltage of 0.75 V of the reference signal COM is supplied as the reset voltage.

Thus, during the reset period Prst, the capacitive elements Ca of all the partial detection areas PAA are sequentially electrically coupled to the signal lines SGL, and are supplied with the reference signal COM. As a result, the capacitance of the capacitive elements Ca is reset. The capacitance of the capacitive elements Ca of some of the partial detection areas PAA can be reset by partially selecting the gate lines and the signal lines SGL.

Examples of the exposure timing control method include a control method of exposure during non-selection of gate lines and a full-time control method of exposure. In the control method of exposure during non-selection of gate lines, the gate drive signals {Vgcl(1), ..., Vgcl(M)} are sequentially supplied to all the gate lines GCL coupled to the photodiodes PD serving as the detection targets, and all the photodiodes PD serving as the detection targets are supplied with the reset voltage. Then, after all the gate lines GCL coupled to the photodiode PD serving as the detection targets are set to a low voltage (the first switching elements Tr are turned off), the exposure starts and the exposure is performed during the exposure period Pex. After the exposure ends, the gate drive signals {Vgcl(1), ..., Vgcl(M)} are sequentially supplied to the gate lines GCL coupled to the photodiode PD serving as the detection targets as described above, and reading is performed during the reading period Pdet. In the full-time control method of exposure, control for performing the exposure can also be performed during the reset period Prst and the reading period Pdet (full-time exposure control). In this case, the exposure period Pex(1) starts after the gate drive signal Vgcl(1) is supplied to the gate line GCL during the reset period Prst. The term "exposure period Pex {(1), ..., (M)}" refers to a period during which the capacitive elements Ca are charged from the photodiodes PD. The electrical charge stored in the capacitive element Ca during the reset period Prst causes a reverse directional current (from cathode to anode) to flow through the photodiode PD due to light irradiation, and the potential difference in the capacitive element Ca decreases. The start timing and the end timing of the actual exposure periods Pex(1), ..., Pex(M) are different among the partial detection areas PAA corresponding to the gate lines GCL. Each of the exposure periods Pex(1), ..., Pex(M) starts when the gate drive signal Vgcl changes from the power supply voltage VDD serving as the high-level voltage to the power supply voltage VSS serving as the low-level voltage during the reset period Prst. Each of the exposure periods Pex(1), ..., Pex(M) ends when the gate drive signal Vgcl changes from the power supply voltage VSS to the power supply voltage VDD during the reading period Pdet. The lengths of the exposure time of the exposure periods Pex(1), ..., Pex(M) are equal.

In the control method of exposure during non-selection of gate lines, a current flows correspondingly to the light irradiating the photodiode PD in each of the partial detection areas PAA during the exposure period Pex {(1) ... (M)}. As a result, an electrical charge is stored in each of the capacitive elements Ca.

At a time before the reading period Pdet starts, the control circuit 122 sets the reset signal RST2 to a low-level voltage. This operation stops operation of the reset circuit 17. The reset signal may be set to a high-level voltage only during the reset period Prst. During the reading period Pdet, the gate line drive circuit 15 sequentially supplies the gate drive signals Vgcl(1) ..., Vgcl(M) to the gate lines GCL in the same manner as during the reset period Prst.

Specifically, the gate line drive circuit 15 supplies the gate drive signal Vgcl(1) at the high-level voltage (power supply voltage VDD) to the gate line GCL(1) during a period V(1). The control circuit 122 sequentially supplies selection signals ASW1, ..., ASW6 to the signal line selection circuit 16 during a period in which the gate drive signal Vgcl(1) is at the high-level voltage (power supply voltage VDD). This operation sequentially or simultaneously couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the gate line drive circuit 15 supplies the gate drive signals Vgcl(2), ..., Vgcl(M−1), Vgcl(M) at the high-level voltage to gate lines GCL(2), ..., GCL(M−1), GCL(M) during periods V(2), ..., V(M−1), V(M), respectively. That is, the gate line drive circuit 15 supplies the gate drive signal Vgcl to the gate line GCL during each of the periods V(1), V(2), ..., V(M−1), V(M). The signal line selection circuit 16 sequentially selects each of the signal lines SGL based on the selection signal ASW in each period in which the gate drive signal Vgcl is set to the high-level voltage. The signal line selection circuit 16 sequentially couples each of the signal lines SGL to one detection circuit 48. Thus, the detection device 1 can output the detection signals Vdet of all the partial detection areas PAA to the detection circuit 48 during the reading period Pdet.

Figure 7:
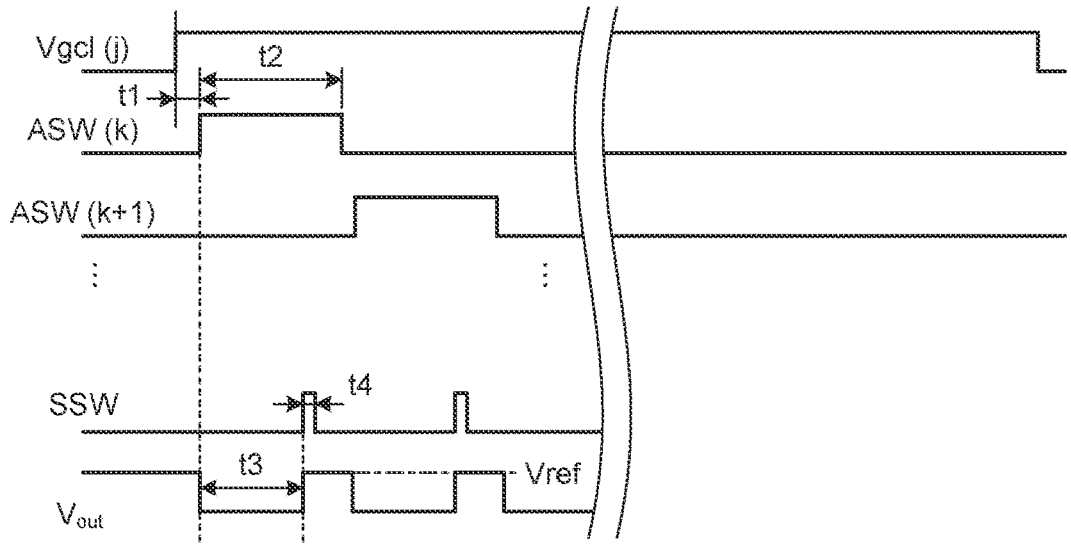
FIG. 7 is a timing waveform diagram illustrating an operation example during a reading period in FIG. 6.

FIG. 7 is a timing waveform diagram illustrating an operation example during the reading period in FIG. 6. With reference to FIG. 7, the following describes the operation example during a supply period Readout of one of the gate drive signals Vgcl(j) in FIG. 6. In FIG. 6, the reference sign of the supply period "Readout" is assigned to the first gate drive signal Vgcl(1), and the same applies to the other gate drive signals Vgcl(2) ..., Vgcl(M). The index j is any one of the natural numbers 1 to M.

As illustrated in FIGS. 7 and 4, the output voltage ($V_{out}$) of each of the third switching elements TrS has been reset to the reference potential (Vref) voltage in advance. The reference potential (Vref) voltage serves as the reset voltage, and is set to, for example, 0.75 V. Then, the gate drive signal Vgcl(j) is set to a high level, and the first switching elements Tr of a corresponding row are turned on. Thus, each of the signal lines SGL in each row is set to a voltage corresponding to the electrical charge stored in the capacitor (capacitive element Ca) of the partial detection area PAA. After a period t1 elapses from a rising edge of the gate drive signal Vgcl(j), a period t2 starts in which the selection signal ASW(k) is set to a high level. After the selection signal ASW(k) is set to the high level and the third switching element TrS is turned on, the electrical charge stored in the capacitor (capacitive element Ca) of the partial detection area PAA coupled to the detection circuit 48 through the third switching element TrS changes the output voltage ($V_{out}$) of the third switching element TrS (refer to FIG. 4) to a voltage corresponding to the electrical charge stored in the capacitor (capacitive element Ca) of the partial detection area PAA (period t3). In the example of FIG. 7, this voltage is reduced from the reset voltage as illustrated in the period t3. Then, after the switch SSW is turned on (period t4 during which an SSW signal is set to a high level), the electrical charge stored in the capacitor (capacitive element Ca) of the partial detection area PAA moves to the capacitor (capacitive element Cb) of the detection signal amplifier 42 of the detection circuit 48, and the output voltage of the detection signal amplifier 42 is set to a voltage corresponding to the electrical charge stored in the capacitive element Cb. At this time, the potential of the inverting input portion of the detection signal amplifier 42 is set to an imaginary short-circuit potential of an operational amplifier, and therefore, returns to the reference potential (Vref). The A/D converter 43 reads the output voltage of the detection signal amplifier 42. In the example of FIG. 7, waveforms of the selection signals ASW(k), ASW(k+1), . . . corresponding to the signal lines SGL of the respective columns are set to a high level to sequentially turn on the third switching elements TrS, and the same operation is sequentially performed. This operation sequentially reads the electrical charges stored in the capacitors (capacitive elements Ca) of the partial detection areas PAA coupled to the gate line GCL. ASW(k), ASW(k+1), . . . in FIG. 7 are, for example, any of ASW 1 to ASW 6 in FIG. 6.

Specifically, after the period t4 starts in which the switch SSW is on, the electrical charge moves from the capacitor (capacitive element Ca) of the partial detection area PAA to the capacitor (capacitive element Cb) of the detection signal amplifier 42 of the detection circuit 48. At this time, the non-inverting input (+) of the detection signal amplifier 42 is biased to the reference potential (Vref) voltage (for example, 0.75 V). As a result, the output voltage ($V_{out}$) of the third switching element TrS is also set to the reference potential (Vref) voltage due to the imaginary short-circuit between input ends of the detection signal amplifier 42. The voltage of the capacitive element Cb is set to a voltage corresponding to the electrical charge stored in the capacitor (capacitive element Ca) of the partial detection area PAA at a location where the third switching element TrS is turned on in response to the selection signal ASW(k). After the output voltage ($V_{out}$) of the third switching element TrS is set to the reference potential (Vref) voltage due to the imaginary short-circuit, the output voltage of the detection signal amplifier 42 reaches a voltage corresponding to the capacitance of the capacitive element Cb, and this output voltage is read by the A/D converter 43. The voltage of the capacitive element Cb is, for example, a voltage between two electrodes provided on a capacitor constituting the capacitive element Cb.

The period t1 is, for example, 20 ρs. The period t2 is, for example, 60 μs. The period t3 is, for example, 44.7 μs. The period t4 is, for example, 0.98 μs.

Although FIGS. 6 and 7 illustrate the example in which the gate line drive circuit 15 selects the gate line GCL individually, the present disclosure is not limited to this example. The gate line drive circuit 15 may simultaneously select a predetermined number (two or more) of the gate lines GCL and sequentially supply the gate drive signals Vgcl to the gate lines GCL in units of the predetermined number of the gate lines GCL. The signal line selection circuit 16 may also simultaneously couple a predetermined number (two or more) of the signal lines SGL to one detection circuit 48. Moreover, the gate line drive circuit 15 may skip some of the gate lines GCL and scan the remaining ones.

Figure 8:
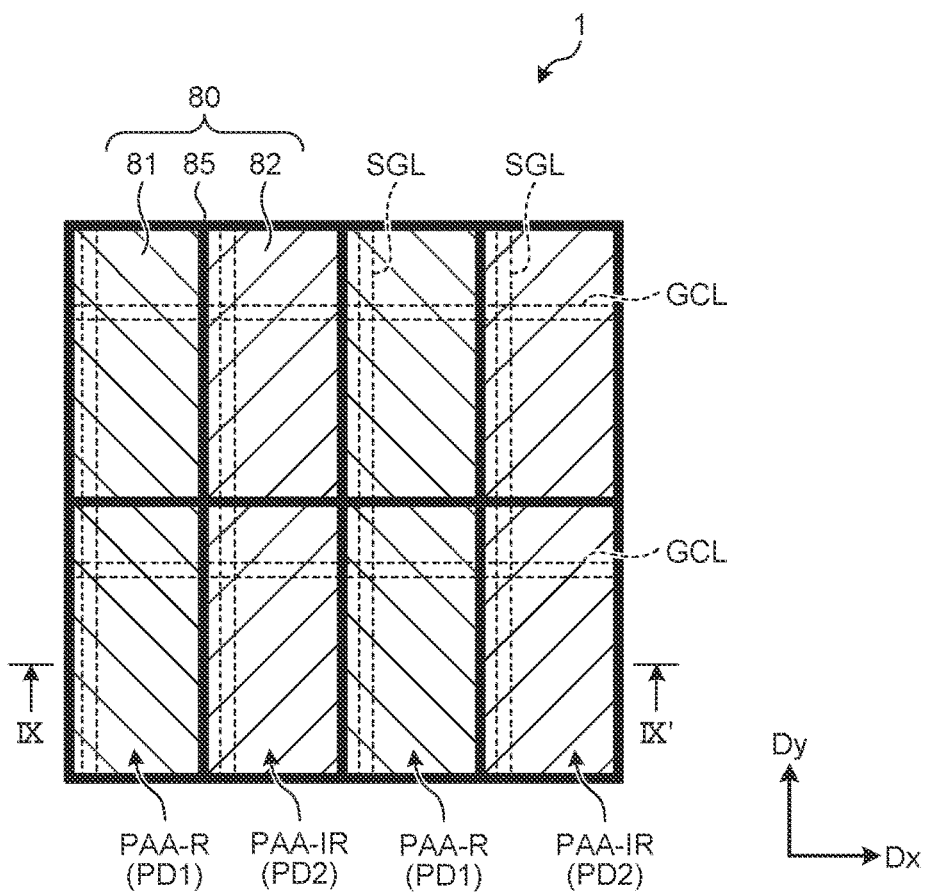
FIG. 8 is a plan view of an optical filter layer.

The following describes a configuration of the optical filter layer 80. FIG. 8 is a plan view of the optical filter layer. As illustrated in FIG. 8, the optical filter layer 80 includes a first color filter 81, a second color filter 82, and a light-blocking layer 85. The first color filter 81 has a function of transmitting the light L1a in the first wavelength band of the light L1 from the light sources 53 and 54. The second color filter 82 has a function of transmitting the light L1b in the second wavelength band of the light L1 from the light sources 53 and 54.

A plurality of the first color filters 81 and a plurality of the second color filters 82 are arranged so as to be separated on a partial detection area PAA basis. The first color filters 81 and the second color filters 82 are alternately arranged along the first direction Dx. The first color filters 81 are arranged in the second direction Dy. The second color filters 82 are arranged in the second direction Dy.

The light-blocking layer 85 is provided between the first color filter 81 and the second color filter 82 adjacent to each other in the first direction Dx. The light-blocking layer 85 is provided between the first color filters 81 adjacent to each other in the second direction Dy, and between the second color filters 82 adjacent to each other in the second direction Dy. In other words, the light-blocking layer 85 is provided between the partial detection areas PAA adjacent to each other. The light-blocking layer 85 is provided so as to overlap the gate lines GCL and the signal lines SGL. However, FIG. 8 illustrates the gate lines GCL and the signal lines SGL in positions offset from the light-blocking layer 85 for the purpose of illustration.

In the present embodiment, the photodiodes PD include first photodiodes PD1 and second photodiodes PD2. The first photodiodes PD1 are provided in areas overlapping the respective first color filters 81 and receive light (light L1a in the first wavelength band) transmitted through the first color filters 81. The second photodiodes PD2 are provided in areas overlapping the respective second color filters 82 and receive light (light L1b in the second wavelength band) transmitted through the second color filters 82.

In the following description, the area overlapping the first color filter 81 may be denoted as a first detection area PAA-R, and the area overlapping the second color filter 82 may be denoted as a second detection area PAA-IR.

Figure 9:
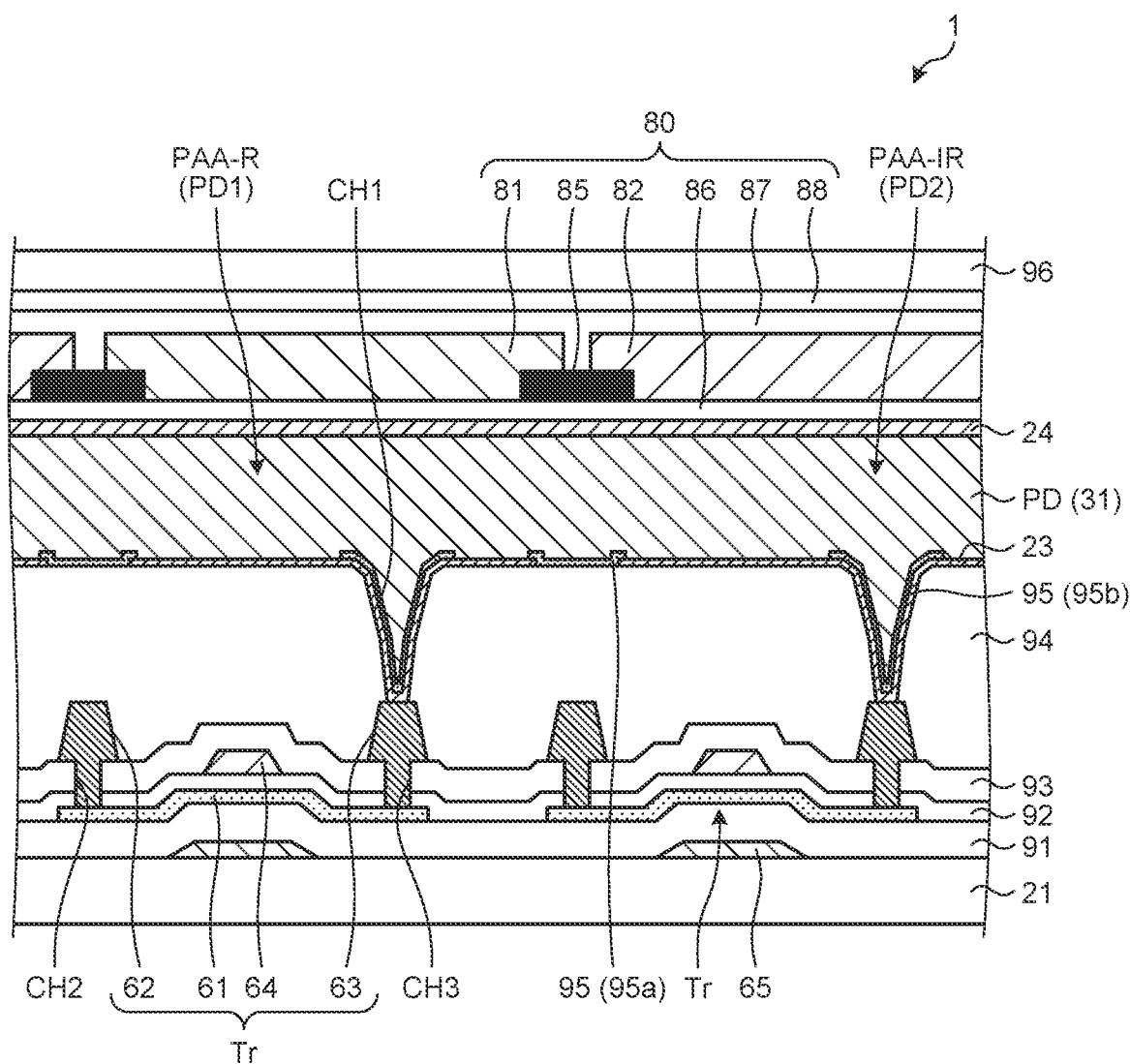
FIG. 9 is a sectional view illustrating a schematic sectional configuration of the detection device.

FIG. 9 is a sectional view illustrating a schematic sectional configuration of the detection device. FIG. 9 is, for example, a IX-IX' sectional view of FIG. 8. As illustrated in FIG. 9, the detection device 1 includes the sensor base member 21, the first switching element Tr, the organic insulating film 94, the lower electrode 23, an inorganic insulating film 95, the photodiode PD (only the active layer 31 is illustrated in FIG. 9), the upper electrode 24, the optical filter layer 80, and the sealing film 96.

In this specification, a direction from the sensor base member 21 toward the photodiode PD in a direction orthogonal to a surface of the sensor base member 21 is referred to as "upper side" or simply "above or on". A direction from the photodiode PD toward the sensor base member 21 is referred to as "lower side" or simply "below".

A light-blocking film 65 is provided on the sensor base member 21. The light-blocking film 65 is provided between a semiconductor layer 61 and the sensor base member 21. The light-blocking film 65 can restrain light from entering a channel region of the semiconductor layer 61 from the sensor base member 21 side.

An undercoat film 91 is provided on the sensor base member 21 so as to cover the light-blocking film 65. The undercoat film 91 is formed of, for example, an inorganic insulating film such as a silicon nitride film or a silicon oxide film. The undercoat film 91 is not limited to be a single-layer film and may be formed of multiple layers of inorganic insulating films.

The first switching element Tr (transistor) is provided above the sensor base member 21. The first switching element Tr is provided for each of the first photodiodes PD1 and the second photodiodes PD2. Specifically, the first switching element Tr includes the semiconductor layer 61, a source electrode 62, a drain electrode 63, and a gate electrode 64. The semiconductor layer 61 is provided on the undercoat film 91. For example, polysilicon is used as the semiconductor layer 61. The semiconductor layer 61 is, however, not limited thereto, and may be formed of, for example, a microcrystalline oxide semiconductor, an amorphous oxide semiconductor, or low-temperature polysilicon.

A gate insulating film 92 is provided on the undercoat film 91 so as to cover the semiconductor layer 61. The gate insulating film 92 is, for example, an inorganic insulating film such as a silicon oxide film. The gate electrode 64 is provided on the gate insulating film 92. In the example illustrated in FIG. 9, the first switching element Tr has a top-gate structure. However, the first switching element Tr is not limited thereto, and may have a bottom-gate structure, or a dual-gate structure in which the gate electrodes 64 are provided on both the upper side and the lower side of the semiconductor layer 61.

An interlayer insulating film 93 is provided on the gate insulating film 92 so as to cover the gate electrode 64. The interlayer insulating film 93 has, for example, a multilayered structure of a silicon nitride film and a silicon oxide film. The source electrode 62 and the drain electrode 63 are provided on the interlayer insulating film 93. The source electrode 62 is coupled to a source region of the semiconductor layer 61 through a second contact hole CH2 provided in the gate insulating film 92 and the interlayer insulating film 93. The drain electrode 63 is coupled to a drain region of the semiconductor layer 61 through a third contact hole CH3 provided in the gate insulating film 92 and the interlayer insulating film 93.

The organic insulating film 94 is provided on the interlayer insulating film 93 so as to cover the source electrode 62 and the drain electrode 63 of the first switching element Tr. The organic insulating film 94 is an organic planarizing film and has a better coverage property for steps formed by wiring and provides better surface flatness than inorganic insulating materials formed by, for example, chemical vapor deposition (CVD).

The lower electrode 23 and the inorganic insulating film 95 are provided on the organic insulating film 94. The photodiode PD is provided on the lower electrode 23. In more detail, the lower electrode 23 is provided on the organic insulating film 94 and is coupled to the drain electrode 63 of the first switching element Tr at the bottom of a first contact hole CH1 formed in the organic insulating film 94. The lower electrode 23 is a cathode electrode of the photodiode PD. The lower electrodes 23 are arranged so as to be separated from one another in units of detection areas PAA (first photodiode PD1 and second photodiode PD2).

The inorganic insulating film 95 is provided so as to partially cover the lower electrode 23. For example, a silicon nitride film or an aluminum oxide film is used as the material of the inorganic insulating film 95. In more detail, an inorganic insulating film 95*a* is provided on the organic insulating film 94 between the lower electrodes 23 adjacent to each other and covers outer edges of the lower electrodes 23. The inorganic insulating film 95*a* insulates the lower electrodes 23 of the photodiodes PD adjacent to each other. The inorganic insulating film 95*a* overlaps the source electrode 62 (signal line SGL) and is located below the light-blocking layer 85 of the optical filter layer 80.

An inorganic insulating film 95*b* is separated from the inorganic insulating film 95*a*, is provided so as to cover the lower electrode 23 in the first contact hole CH1, and overlaps the drain electrode 63.

The photodiode PD has a larger area than that of the lower electrode 23 in the plan view. The photodiode PD (active layer 31) and the upper electrode 24 are continuously provided over the partial detection areas PAA. In other words, the first and the second photodiodes PD1 and PD2 are formed of the same organic semiconductor material and have the same sensitivity characteristics. The first and the second photodiodes PD1 and PD2 are sensitive to both the first and the second wavelength bands of the light L1 emitted from light sources 53 and 54.

The upper electrode 24 is provided on the first and the second photodiodes PD1 and PD2. The upper electrode 24 is an anode electrode of the photodiode PD and is continuously formed over the partial detection areas PAA (photodiodes PD).

The optical filter layer 80 further includes inorganic insulating films 86, 88 and an overcoat layer 87. The inorganic insulating film 86 is provided on the upper electrode 24. The first color filter 81, the second color filter 82 and the light-blocking layer 85 are provided on the inorganic insulating film 86. The light-blocking layer 85 is provided between the first color filter 81 and the second color filter 82 adjacent to each other. An outer edge of the first color filter 81 and an outer edge of the second color filter 82 partially cover the light-blocking layer 85.

The first and the second color filters 81 and 82 are made using resist materials corresponding to the first and the second wavelength bands, respectively, and are patterned for each of the partial detection areas PAA using photolithography.

The overcoat layer 87 is provided so as to cover the first color filter 81, the second color filter 82, and the light-blocking layer 85. The overcoat layer 87 is formed so as to planarize the steps formed by the first color filter 81, the second color filter 82, and the light-blocking layer 85. The inorganic insulating film 88 is provided on the overcoat layer 87.

The sealing film 96 is provided on the inorganic insulating film 88. An inorganic film such as a silicon nitride film or an aluminum oxide film or a resin film such as an acrylic film is used as the sealing film 96. The sealing film 96 is not limited to a single layer, and may be a multilayered film of two or more layers obtained by combining the inorganic film with the resin film described above. The optical filter layer 80 and the sealing film 96 well seal the photodiode PD, and thus can restrain water from entering the photodiode PD from the upper surface side.

With the above-described configuration, the first photodiode PD1 in the first detection area PAA-R receives the light in the first wavelength band (for example, red light) transmitted through the first color filter 81. The second photodiode PD2 in the second detection area PAA-IR receives the light in the second wavelength band (for example, infrared light) transmitted through the second color filter 82. Since the light-blocking layer 85 is provided between the first and the second color filters 81 and 82 adjacent to each other, color mixing between the first and the second photodiodes PD1 and PD2 can be reduced. That is, the light-blocking layer 85 restrains the light in the first wavelength band (for example, red light) transmitted through the first color filter 81 from entering the second photodiode PD2, and restrains the light in the second wavelength band (for example, infrared light) transmitted through the second color filter 82 from entering the first photodiode PD1.

Figure 10:
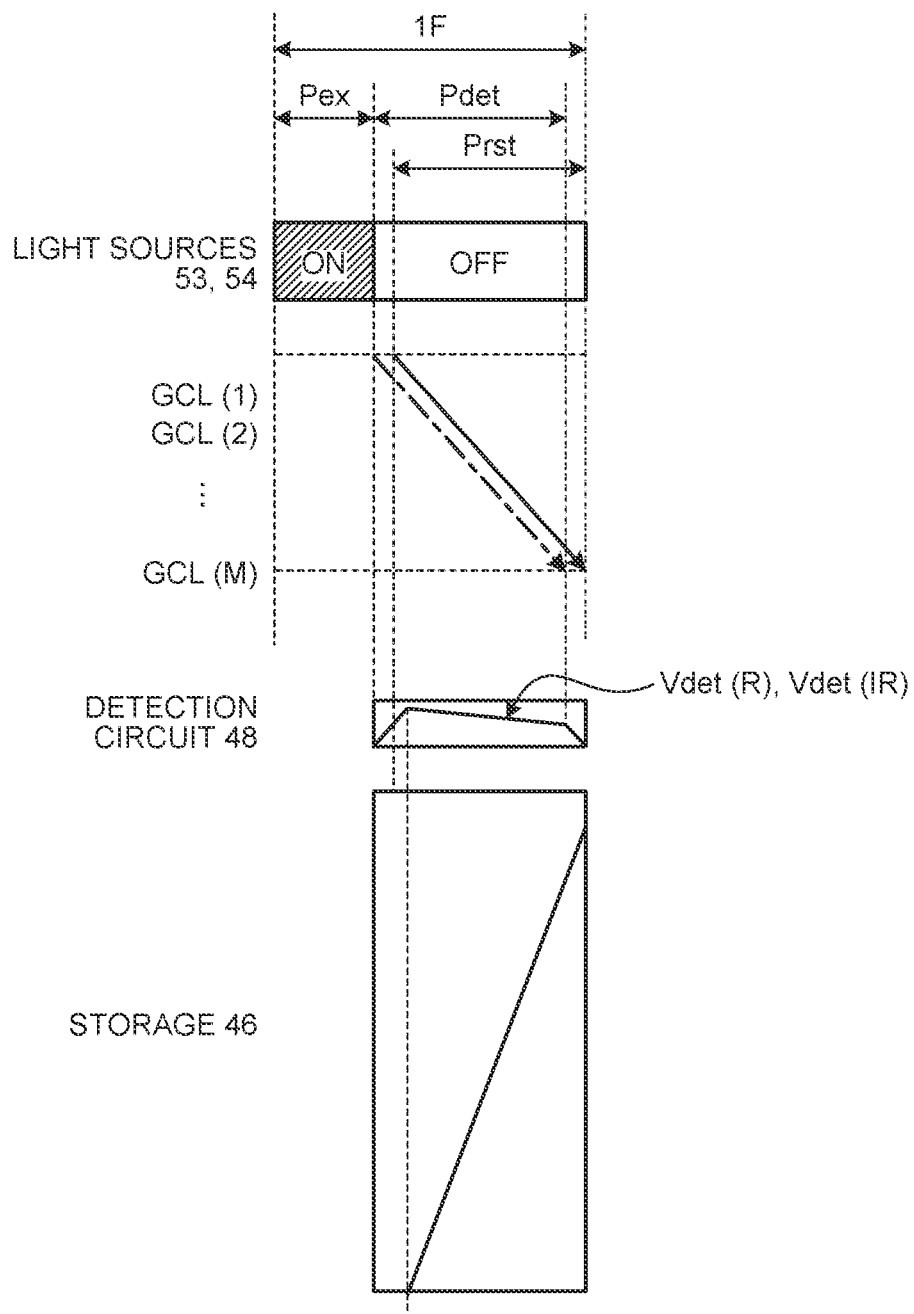
FIG. 10 is an explanatory diagram for explaining a relation between driving of the sensor of the detection device and a lighting operation of a light source.

FIG. 10 is an explanatory diagram for explaining a relation between the driving of the sensor of the detection device and the lighting operation of the light source. As illustrated in FIG. 10, during the exposure period Pex, the light sources 53 and 54 are on and emit the light L1 including the first and the second wavelength bands. At this time, the light L1 simultaneously irradiates both the first detection area PAA-R (first color filter 81) and the second detection area PAA-IR (second color filter 82). The light L1 passes through the first and the second color filters 81 and 82, and simultaneously irradiates the first and the second photodiodes PD1 and PD2, respectively.

The gate line drive circuit 15 scans the gate lines GCL, and sequentially performs the processing in the reading period Pdet and the reset period Prst described above with reference to FIGS. 6 and 7. As a result, the first photodiode PD1 in the first detection area PAA-R outputs a detection signal Vdet(R) corresponding to the light L1a in the first wavelength band. The second photodiode PD2 in the second detection area PAA-IR outputs a detection signal Vdet(IR) corresponding to the light L1b in the second wavelength band.

The detection circuit 48 performs signal processing on each of the detection signal Vdet(R) received from the first photodiode PD1 and the detection signal Vdet(IR) received from the second photodiode PD2. The signal processor 44 performs calculations including a calculation of a difference between the detection signal Vdet(R) and the detection signal Vdet(IR) after being processed, and the calculation results are sequentially stored in the storage 46.

The light sources 53 and 54 are unlit during the reading period Pdet and the reset period Prst, and are repeatedly lit and unlit in a time-division manner for each period. However, the present disclosure is not limited to this method. The light sources 53 and 54 may also be continuously lit during the reading period Pdet and reset period Prst.

Since the detection device 1 of the present embodiment is provided with the first color filter 81 and the second color filter 82, the detection of the light L1a in the first wavelength band by the first photodiode PD1 and the detection of the light L1b in the second wavelength band by the second photodiode PD2 can be performed in the same period. That is, the irradiation with the light L1a in the first wavelength band and the irradiation with the light Lib in the second wavelength band can be simultaneously performed. Therefore, compared with a case where the detection of the light L1a in the first wavelength band and the detection of the light L1b in the second wavelength band are performed in a time-division manner, the frame rate of the detection can be restrained from decreasing.

As described above, the detection device 1 of the present embodiment includes the light sources 53 and 54 that emit the light L1 including the first and the second wavelength bands, the first color filter 81 that transmits the light L1a in the first wavelength band, the second color filter 82 that transmits the light L1b in the second wavelength band, the first photodiode PD1 that receives the light L1 transmitted through the first color filter 81, and the second photodiode PD2 that receives the light L1 transmitted through the second color filter 82.

With this configuration, the broadband light L1 including the first and the second wavelength bands and emitted from the light sources 53 and 54 is spatially separated into light in the respective wavelength bands by the first color filter 81 and the second color filter 82. The first photodiode PD1 receives the light in the first wavelength band (for example, red light) transmitted through the first color filter 81. The second photodiode PD2 receives the light in the second wavelength band (for example, infrared light) transmitted through the second color filter 82.

That is, the detection device 1 can detect the detection signals Vdet corresponding to two or more different wavelength bands, using the light sources 53 and 54 that emit the common light L1 and the first and the second photodiodes PD1 and PD2 that have the same sensitivity characteristics. In other words, it is not necessary to provide a plurality of types of light sources for two or more respective different wavelength bands, nor to provide a plurality of types of the photodiodes PD having two or more different types of sensitivity characteristics.

First Modification

Figure 11:
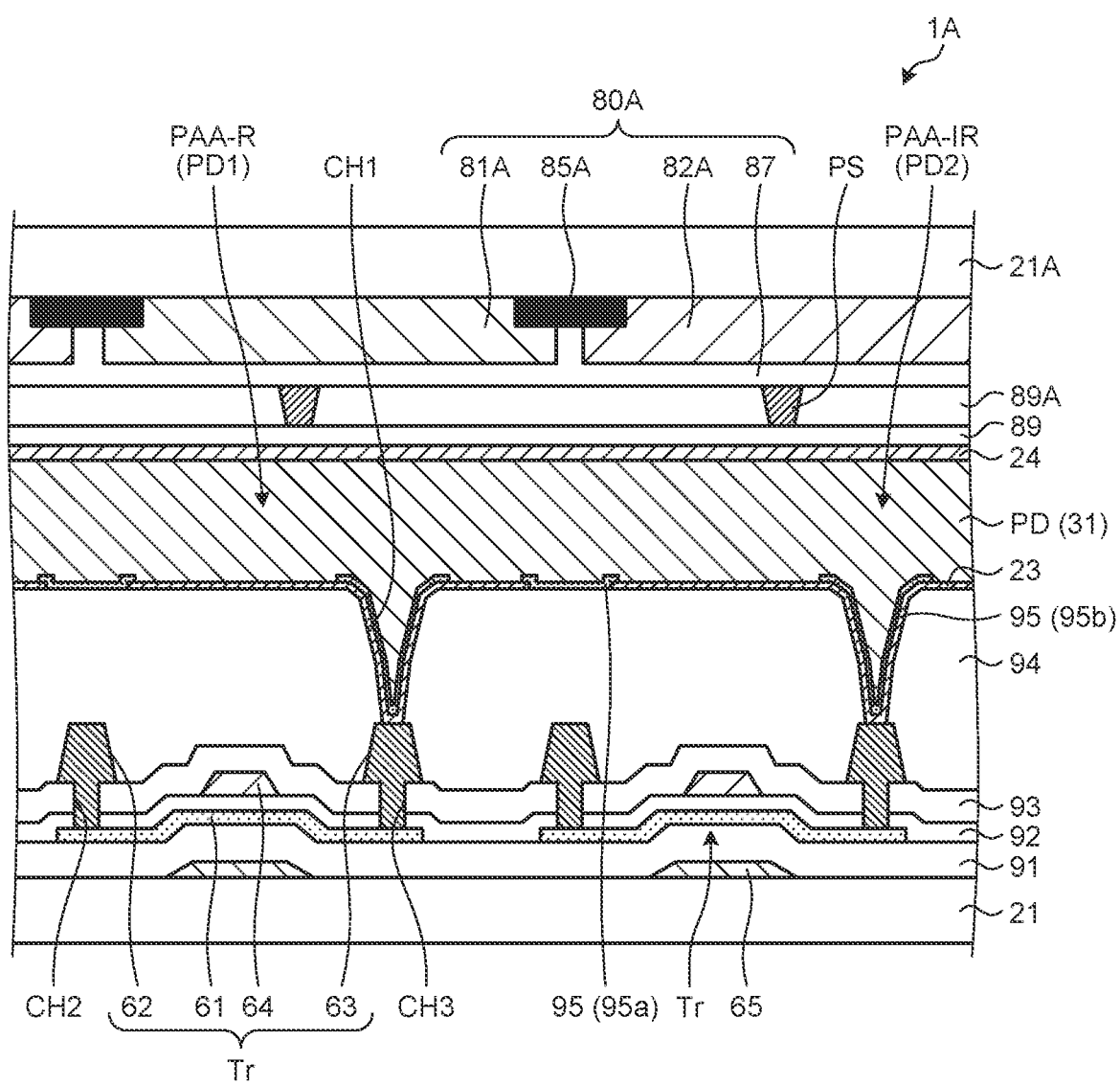
FIG. 11 is a sectional view illustrating a schematic sectional configuration of a detection device according to a first modification.

FIG. 11 is a sectional view illustrating a schematic sectional configuration of a detection device according to a first modification. As illustrated in FIG. 11, a detection device 1A according to the first modification further includes a counter substrate 21A. The counter substrate 21A is provided on the upper side of the first photodiodes PD1 and the second photodiodes PD2, and faces the sensor base member 21.

An optical filter layer 80A is provided on a surface of the counter substrate 21A facing the sensor base member 21 (surface facing the first photodiodes PD1 and the second photodiodes PD2). The first color filters 81A, the second color filters 82A, and a light-blocking layer 85A are provided in direct contact with the surface of the counter substrate 21A facing the sensor base member 21. The overcoat layer 87 is provided so as to cover the first color filters 81A, the second color filters 82A, and the light-blocking layer 85A.

The detection device 1A of the present embodiment is manufactured by bonding the sensor base member 21 with the switching elements Tr and the photodiodes PD formed thereon to the counter substrate 21A with the optical filter layer 80A formed thereon, with an adhesive layer 89A interposed therebetween. A spacer PS is provided between the overcoat layer 87 and an inorganic insulating film 89. The spacer PS defines a distance between the substrates when the sensor base member 21 is bonded to the counter substrate 21A.

In other words, the first switching elements Tr, the organic insulating film 94, the lower electrode 23, the photodiodes PD (first photodiodes PD1 and second photodiodes PD2), the upper electrode 24, the inorganic insulating film 89, the adhesive layer 89A, the optical filter layer (first color filters 81A and second color filters 82A), and the counter substrate 21A are stacked in the order as listed, in the direction orthogonal to the sensor base member 21.

The first color filters 81A, the second color filters 82A, and the light-blocking layer 85A are not limited to being provided directly on the counter substrate 21A and may be provided on the counter substrate 21A with an insulating film interposed therebetween.

In the detection device 1A of the first modification, the first color filters 81A, the second color filters 82A, and the light-blocking layer 85A are formed on the counter substrate 21A. Therefore, damage to the photodiodes PD can be reduced as compared with the case where the first color filters 81, the second color filters 82, and the light-blocking layer 85 are patterned on the photodiodes PD.

Since the counter substrate 21A and the optical filter layer 80A are provided so as to cover the photodiodes PD, water can be restrained from entering the photodiodes PD from the upper surface side. That is, in the first modification, at least the counter substrate 21A also performs the function of the sealing film 96 (refer to FIG. 9).

Second Modification

Figure 12:
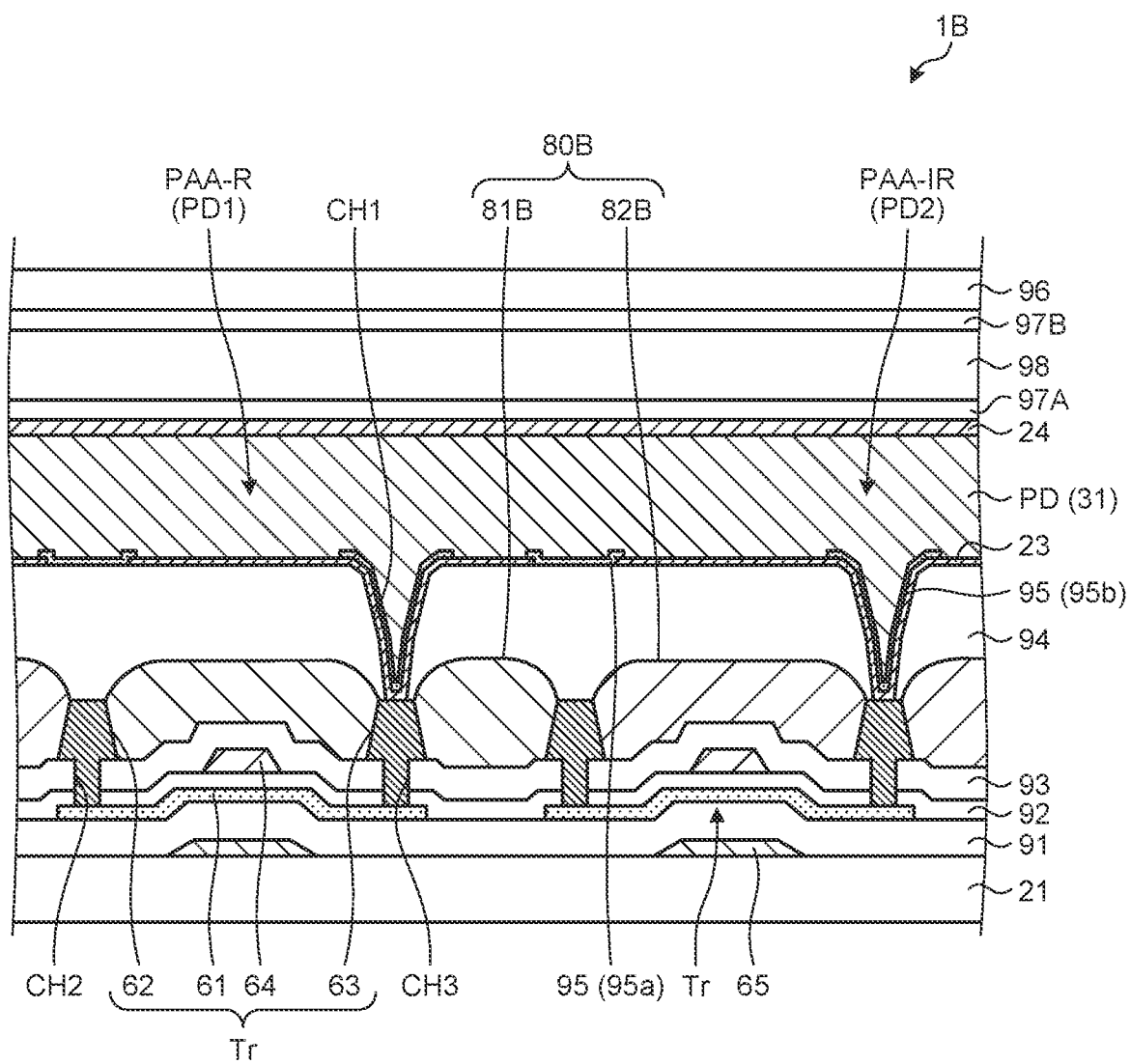
FIG. 12 is a sectional view illustrating a schematic sectional configuration of a detection device according to a second modification.

FIG. 12 is a sectional view illustrating a schematic sectional configuration of a detection device according to a second modification. As illustrated in FIG. 12, in a detection device 1B according to the second modification, an optical filter layer 80B is provided between the sensor base member 21 and the photodiodes PD.

In more detail, a plurality of first color filters 81B and a plurality of second color filters 82B are provided on the first switching elements Tr (transistors). The first color filters 81B and the second color filters 82B are provided in the same layer as that of the source electrodes 62 and the drain electrodes 63 on the interlayer insulating film 93. The first color filters 81B and the second color filters 82B have openings in areas overlapping the source electrodes 62 and the drain electrodes 63. The openings of the first color filters 81B and the second color filters 82B only need to be provided at least in areas overlapping the first contact holes CH1.

The first photodiodes PD1 and the second photodiodes PD2 are provided on the first color filters 81B and the second color filters 82B with the organic insulating film 94 interposed therebetween.

A first inorganic insulating film 97A, a sealing resin 98, a second inorganic insulating film 97B, and the sealing film 96 are stacked on the photodiodes PD in the order as listed. This configuration well seals the upper surface side of the photodiodes PD.

The detection device 1B is a lower-side light receiving optical sensor that the light from the light sources 53 and 54 enters from the second surface S2 side of the sensor base member 21 (refer to FIG. 5). Also, in the second modification, the broadband light L1 including the first and the second wavelength bands and emitted from the sensor base member 21 side is spatially separated into light in the respective wavelength bands by the first color filters 81B and the second color filters 82B. The first photodiodes PD1 receive the light in the first wavelength band (for example, red light) transmitted through the first color filters 81B. The second photodiodes PD2 receive the light in the second wavelength band (for example, infrared light) transmitted through the second color filters 82B.

In the second modification, since the optical filter layer 80B is provided between the sensor base member 21 and the photodiodes PD, the detection device 1B can be made thinner than in a configuration in which the optical filter layer 80B is separately provided on the second surface S2 side of the sensor base member 21.

Second Embodiment

Figure 13:
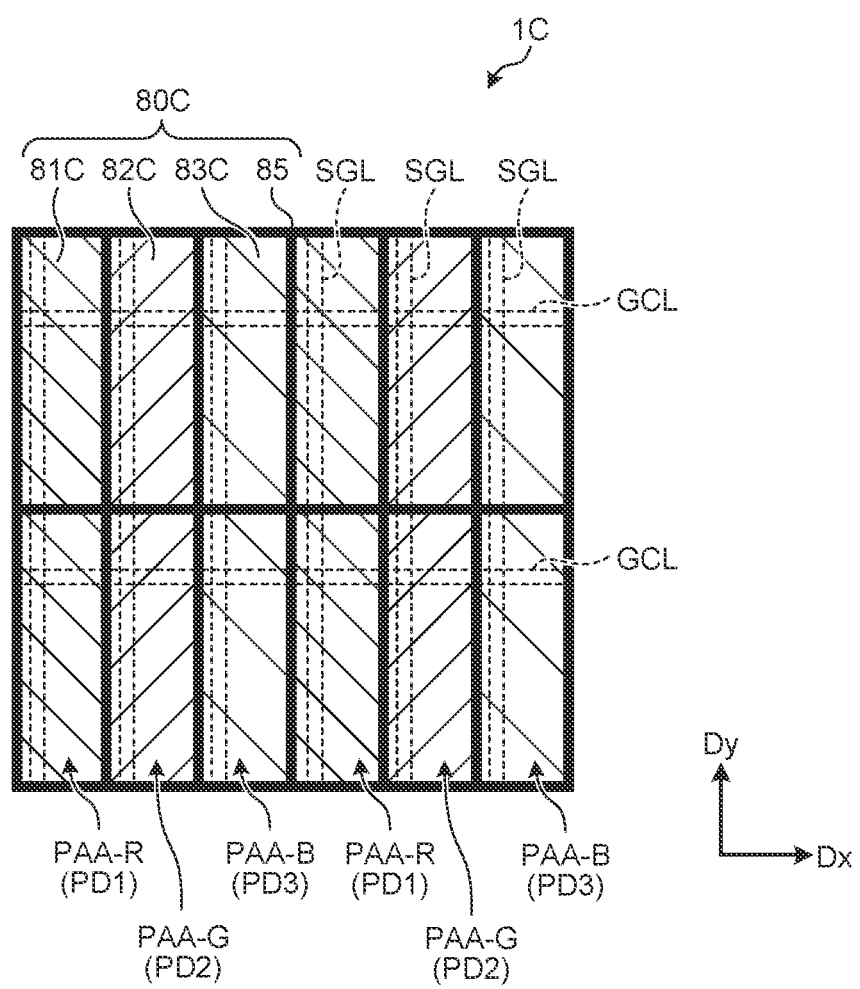
FIG. 13 is a plan view of a filter layer included in a detection device according to a second embodiment.

FIG. 13 is a plan view of a filter layer included in a detection device according to a second embodiment. As illustrated in FIG. 13, in a detection device 1C according to the second embodiment, an optical filter layer 80C includes a first color filter 81C, a second color filter 82C, and a third color filter 83C. The first color filter 81C transmits the light L1a (for example, red light) in the first wavelength band. The second color filter 82C transmits the light L1b (for example, green light) in the second wavelength band. The third color filter 83C transmits light in a third wavelength band (for example, blue light). The first color filter 81C, the second color filter 82C and the third color filter 83C are repeatedly arranged in the order as listed, along the first direction Dx.

The photodiode PD includes the first photodiode PD1, the second photodiode PD2, and a third photodiode PD3. The first photodiode PD1, the second photodiode PD2, and the third photodiode PD3 are repeatedly arranged in the order as listed, along the first direction Dx.

The first photodiode PD1 receives light (for example, red light) transmitted through the first color filter 81C. The second photodiode PD2 receives light (for example, green light) transmitted through the second color filter 82C. The third photodiode PD3 receives light (for example, blue light) transmitted through the third color filter 83C.

In the second embodiment, the light L1 emitted from light sources 53, 54, and 55 (the light sources 55 are not illustrated) is broadband light that includes the light L1a in the first wavelength band, the light L1b in the second wavelength band, and light L1c in the third wavelength band. The light L1 emitted from the light sources 53, 54, and 55 passes through the first color filter 81C, the second color filter 82C, and the third color filter 83C, and simultaneously irradiates the first photodiode PD1, the second photodiode PD2, and the third photodiode PD3, respectively.

The detector 40 (refer to FIG. 2) including the image processor 49 generates two-dimensional information based on the detection signals Vdet from the first photodiode PD1, the second photodiode PD2, and the third photodiode PD3. The detection device 1C of the present embodiment is applied to, for example, an imaging device such as a color scanner.

While the preferred embodiments of the present disclosure have been described above, the present disclosure is not limited to the embodiments described above. The content disclosed in the embodiments is merely an example, and can be variously modified within the scope not departing from the gist of the present disclosure. Any modification appropriately made within the scope not departing from the gist of the present disclosure also naturally belongs to the technical scope of the present disclosure. At least one of various omissions, substitutions, and changes of the components can be made without departing from the gist of the embodiments and the modifications described above.

What is claimed is:

1. A detection device comprising:
a light source configured to emit light that includes a first wavelength band and a second wavelength band;
a plurality of color filters, including:
a plurality of first color filters configured to transmit light in the first wavelength band, and
a plurality of second color filters configured to transmit light in the second wavelength band;
a plurality of first photodiodes configured to receive light transmitted through the first color filters;
a plurality of second photodiodes configured to receive light transmitted through the second color filters;
a substrate provided with the first photodiodes and the second photodiodes;
an upper electrode provided on the first photodiodes and the second photodiodes;
a first inorganic insulating film provided between color filters and the upper electrode; and
an overcoat layer, wherein
the first color filters and the second color filters are alternately arranged in a first direction on the substrate,
the first inorganic insulating film is in direct contact with the upper electrode, the first color filters, and the second color filters,
the overcoat layer is in contact with an upper surface of a light-blocking layer between the color filters adjacent to each other,
a third inorganic insulating film is on and in contact with the overcoat layer, and
a sealing film is on and in contact with the third inorganic insulating film.

2. The detection device according to claim 1, wherein the light emitted from the light source passes through the first color filters and the second color filters, and simultaneously irradiates the first photodiodes and the second photodiodes.

3. The detection device according to claim 1, wherein
the first wavelength band is a wavelength band that represents a red color, and
the second wavelength band is a wavelength band that represents infrared light.

4. The detection device according to claim 1, comprising a counter substrate provided on an upper side of each of a plurality of the first photodiodes and a plurality of the second photodiodes, wherein
a plurality of the first color filters and a plurality of the second color filters are provided to a surface of the counter substrate facing the first photodiodes and the second photodiodes.

5. The detection device according to claim 1, comprising a plurality of transistors provided corresponding to a plurality of the first photodiodes and a plurality of the second photodiodes, wherein
a plurality of the first color filters and a plurality of the second color filters are provided on the transistors, and
the first photodiodes and the second photodiodes are provided on the first color filters and the second color filters with an organic insulating film interposed between the first and the second photodiodes and the first and the second color filters.

6. The detection device according to claim 1, further comprising:
a plurality of transistors provided corresponding to each of the first photodiodes and the second photodiodes;
a plurality of signal lines coupled to the transistors;
a plurality of gate lines coupled to the transistors; and
the light-blocking layer, which is disposed between the first color filters and the second color filters and overlaps the signal lines and the gate lines.

7. The detection device according to claim 1, further comprising:
the light-blocking layer;
a lower electrode provided under the first photodiodes and the second photodiodes; and
a second inorganic insulating film provided so as to partially cover the lower electrode, wherein
the light-blocking layer overlaps the second inorganic insulating film.

8. The detection device according to claim 1, wherein
the light-blocking layer faces a second inorganic insulating film, and
a fourth inorganic insulating film that is in a same layer of the second inorganic insulating film, covers a contact hole coupling a lower electrode and a drain electrode.

9. A detection device comprising:
a light source configured to emit light that includes a first wavelength band, a second wavelength band, and a third wavelength band;
a plurality of color filters, including:
a first color filter configured to transmit light in the first wavelength band,
a second color filter configured to transmit light in the second wavelength band, and
a third color filter configured to transmit light in the third wavelength band;
a first photodiode configured to receive light transmitted through the first color filter;
a second photodiode configured to receive light transmitted through the second color filter;
a third photodiode configured to receive light transmitted through the third color filter;
an upper electrode provided on the first photodiodes, the second photodiodes, and the third photodiodes;
a first inorganic insulating film provided between color filters and the upper electrode; and
an overcoat layer, wherein
the first inorganic insulating film is in direct contact with the upper electrode, the first color filters, the second color filters, and the third color filters,
the overcoat layer is in contact with an upper surface of a light-blocking layer between the color filters adjacent to each other,
a third inorganic insulating film is on and in contact with the overcoat layer, and
a sealing film is on and in contact with the third inorganic insulating film.

10. The detection device according to claim 9, wherein the light emitted from the light source passes through the first color filter, the second color filter, and the third color filter, and simultaneously irradiates the first photodiode, the second photodiode, and the third photodiode.

11. The detection device according to claim 9, wherein
the first wavelength band is a wavelength band that represents a red color,
the second wavelength band is a wavelength band that represents a green color, and
the third wavelength band is a wavelength band that represents a blue color.

12. An imaging device comprising:
the detection device according to claim 9; and
an image processor configured to generate two-dimensional information based on detection signals from the first photodiode, the second photodiode, and the third photodiode.

13. The detection device according to claim 9, further comprising:
a plurality of transistors provided corresponding to each of the first photodiodes, the second photodiodes, and the third photodiodes;
a plurality of signal lines coupled to the transistors;
a plurality of gate lines coupled to the transistors; and
the light-blocking layer, which is disposed between the first color filters, the second color filters, and the third color filters and overlaps the signal lines and the gate lines.

14. The detection device according to claim 9, further comprising:
the light-blocking layer;
a lower electrode provided under the first photodiodes and the second photodiodes; and
a second inorganic insulating film provided so as to partially cover the lower electrode, wherein
the light-blocking layer overlaps the second inorganic insulating film.

* * * * *